US011329669B2

(12) United States Patent
Miura et al.

(10) Patent No.: US 11,329,669 B2
(45) Date of Patent: May 10, 2022

(54) MULTI-LANE SERIALIZER DEVICE

(71) Applicant: THINE ELECTRONICS, INC., Tokyo (JP)

(72) Inventors: Satoshi Miura, Tokyo (JP); Yusuke Fujita, Tokyo (JP)

(73) Assignee: THINE ELECTRONICS. INC., Tokyo (JP)

( * ) Notice: Subject to any disclaimer, the term of this patent is extended or adjusted under 35 U.S.C. 154(b) by 0 days.

(21) Appl. No.: 16/972,349

(22) PCT Filed: Jun. 19, 2019

(86) PCT No.: PCT/JP2019/024374
§ 371 (c)(1),
(2) Date: Dec. 4, 2020

(87) PCT Pub. No.: WO2020/021919
PCT Pub. Date: Jan. 30, 2020

(65) Prior Publication Data
US 2021/0234553 A1    Jul. 29, 2021

(30) Foreign Application Priority Data
Jul. 27, 2018 (JP) .............................. JP2018-141409

(51) Int. Cl.
*H03M 9/00* (2006.01)
*H04L 7/00* (2006.01)
*H04L 7/04* (2006.01)

(52) U.S. Cl.
CPC ............ *H03M 9/00* (2013.01); *H04L 7/0012* (2013.01); *H04L 7/042* (2013.01)

(58) Field of Classification Search
CPC ........ H03M 9/00; H04L 7/0012; H04L 7/042; H04L 7/0008; H04L 25/02; H04L 7/027; H04L 25/38

(Continued)

(56) References Cited

U.S. PATENT DOCUMENTS 7,746,251 B2    6/2010  Gonzalez
9,774,478 B1 *  9/2017  Mendel .................. H04L 47/56
(Continued)

FOREIGN PATENT DOCUMENTS

JP          6-244739 A     9/1994
JP          2011-66621 A   3/2011
(Continued)

OTHER PUBLICATIONS

International Preliminary Report on Patentability with translation of Written Opinion dated Feb. 11, 2021, in Application No. PCT/JP2019/024374.

(Continued)

*Primary Examiner* — Don N Vo
(74) *Attorney, Agent, or Firm* — Sughrue Mion, PLLC

(57) ABSTRACT

A multi-lane serializer device 1 includes serializer circuits $10_1$ to $10_N$ and a controller 20. A phase difference detector of each serializer circuit detects a phase difference between a load signal and a first clock, and outputs an abnormal detection signal to the controller 20 when the detected phase difference is abnormal. When the controller 20 receives the abnormal detection signal from any of the serializer circuits, the controller 20 transmits a batch reset instruction signal to all the serializer circuits. Then, in all the serializer circuits, when a reset signal generator receives the batch reset instruction signal output from the controller 20, the reset signal generator transmits a reset instruction signal to a load signal generator to reset the operation of a load signal generation in the load signal generator.

6 Claims, 6 Drawing Sheets

(58) Field of Classification Search
USPC .................................................. 375/50, 101
See application file for complete search history.

(56) References Cited

U.S. PATENT DOCUMENTS

| | | | |
|---|---|---|---|
| 10,313,099 B1* | 6/2019 | Li | G06F 1/24 |
| 2011/0191619 A1* | 8/2011 | Morrison | H04J 3/0685 |
| | | | 713/500 |
| 2014/0153680 A1* | 6/2014 | Garg | H04L 7/0025 |
| | | | 375/371 |

FOREIGN PATENT DOCUMENTS

| | | |
|---|---|---|
| JP | 2012-39448 A | 2/2012 |
| JP | 2017-123607 A | 7/2017 |
| WO | 2017/119488 A1 | 7/2017 |

OTHER PUBLICATIONS

International Search Report for PCT/JP2019/024374 dated, dated Aug. 20, 2019 (PCT/ISA/210).

* cited by examiner

MULTI-LANE SERIALIZER DEVICE

TECHNICAL FIELD

The present invention relates to a multi-lane serializer device including serializer circuits of a plurality of lanes.

BACKGROUND ART

A serializer circuit serializes parallel data that is input in synchronization with a first clock, and outputs serial data in synchronization with a second clock. The serializer circuit latches the parallel data at a timing indicated by a load signal having the same period as that of the first clock, and outputs the latched data as serial data in synchronization with the second clock. The period of the second clock is shorter than the period of the first clock. The load signal has the same period as the first clock, and is generated based on the second clock (refer to Patent Literature 1).

In the serializer circuit, it is important that the phase difference between the first clock and the load signal is set within an appropriate range according to the margins of the setup time and the hold time during the latch operation so that the parallel data can be reliably latched.

When the phase difference between the first clock and the load signal deviates from the appropriate range due to a malfunction caused by noise or a temperature change, an error occurs in the serial data output from the serializer circuit. When a receiver that receives the serial data output from the serializer circuit detects that the bit error rate of the received data is high, the receiver notifies the serializer circuit on the transmitting side that the bit error rate of the received data is high. Then, in the serializer circuit that has received the notification, the operation of a load signal generation is reset so that the phase difference between the first clock and the load signal is recovered within the appropriate range.

However, the premise of the system configuration in which a notification that the bit error rate is high is transmitted from the receiver to the serializer circuit on the transmitting side is bidirectional communication. In addition, the premise of the system configuration is that the speed of communication from the receiving side to the serializer circuit on the transmitting side is high.

When there is no communication line from the receiving side to the transmitting side, the notification that the bit error rate is high cannot be transmitted from the receiver to the serializer circuit on the transmitting side. Therefore, in the serializer circuit, the phase difference between the first clock and the load signal cannot be recovered within the appropriate range.

Even if there is a communication line from the receiving side to the transmitting side, when the communication line is simple and slow, it takes a long time for the receiver to notify the serializer circuit on the transmitting side that the bit error rate is high. Therefore, since it takes a long time to recover the phase difference between the first clock and the load signal within the appropriate range in the serializer circuit, the bit error rate continues to be high over a long period of time.

Patent Literatures 2 and 3 disclose inventions intended to solve such problems. The serializer circuits described in these literatures detect a phase difference between the first clock and the load signal, and reset or temporarily stop the operation of a load signal generator that generates a load signal when the detected phase difference is out of an appropriate range. In this manner, the serializer circuit can recover the phase difference between the first clock and the load signal within the appropriate range, so that the bit error rate can be reduced at an early stage with a simple configuration.

CITATION LIST

Patent Literature

Patent Literature 1: U.S. Pat. No. 7,746,251
Patent Literature 2: Japanese Unexamined Patent Publication No. 2017-123607
Patent Literature 3: Japanese Unexamined Patent Publication No. H6-244739

SUMMARY OF INVENTION

Problem to be Solved by the Invention

However, according to the findings of the present inventors, in a multi-lane serializer device including serializer circuits of a plurality of lanes, assuming that each serializer circuit is configured as in the inventions disclosed in Patent Literatures 2 and 3, the following problem may occur. That is, the input timings of the first clock to the respective serializer circuits are slightly different due to the skew between lanes. Therefore, when the operation of a load signal generation is reset or temporarily stopped individually in each serializer circuit when necessary, the output timing of serial data may be significantly different between the serializer circuits of a plurality of lanes. As a result, the required specifications for Inter Pair Skew (IPS) may not be satisfied between the pieces of serial data output from the serializer circuits of a plurality of lanes. In the IPS, a difference in output timing of serial data between serializer circuits of a plurality of lanes is expressed by the number of bits of serial data.

Even when there is the IPS between the serializer circuits of a plurality of lanes, it is possible to deal with the IPS problem by using a FIFO (First-In First-Out) memory. However, since a large capacity FIFO is required as the speed increases, the power consumption of the FIFO increases, the layout area of the FIFO increases, and the delay due to the FIFO increases. Therefore, it is desired to reduce the IPS between the serializer circuits of a plurality of lanes.

The present invention has been made to solve the aforementioned problems, and it is an object of the present invention to provide a multi-lane serializer device capable of reducing the bit error rate at an early stage with a simple configuration in each serializer circuit and reducing the IPS between serializer circuits of a plurality of lanes.

Solution to Problem

A multi-lane serializer device of the present invention comprises (1) serializer circuits each serializing parallel data input in synchronization with a first clock and outputting serial data in synchronization with a second clock and (2) a controller that controls operations of the plurality of serializer circuits. Each of the serializer circuits includes (a) a converter that latches the parallel data at a timing indicated by a load signal having the same period as the first clock and outputs the latched data as serial data in synchronization with the second clock, (b) a load signal generator that generates the load signal based on the second clock, wherein the load signal generator resets an operation of a load signal generation when the load signal generator receives a reset instruction signal, (c) a phase difference detector that detects a phase difference between the load signal and the first clock and outputs an abnormal detection signal to the controller when the detected phase difference is abnormal, and (d) a reset signal generator that generates the reset instruction signal and provides the generated reset instruction signal to the load signal generator when the reset signal generator receives a batch reset instruction signal output from the controller. The controller provides the batch reset instruction signal to the reset signal generator of each of the serializer circuits when the controller receives the abnormal detection signal from the phase difference detector of any one of the serializer circuits.

In the present invention, it is preferable that each of the serializer circuits further includes (e) a latch circuit that latches the input parallel data at a timing indicated by the first clock. In this case, in each of the plurality of serializer circuits, the converter latches the parallel data latched and output by the latch circuit at a timing indicated by the load signal.

Each of the serializer circuits further includes (f) a first latch circuit that latches the input parallel data at a timing indicated by the first clock and (g) a second latch circuit that latches the parallel data latched and output by the first latch circuit at a timing indicated by a third clock having the same period as the first clock. In this case, in each of the serializer circuits, the converter latches the parallel data latched and output by the second latch circuit at a timing indicated by the load signal.

Effects of Invention

According to the present invention, it is possible to reduce the bit error rate at an early stage with a simple configuration in each serializer circuit and reduce the IPS between the serializer circuits of a plurality of lanes.

DESCRIPTION OF EMBODIMENTS

Figure 1:
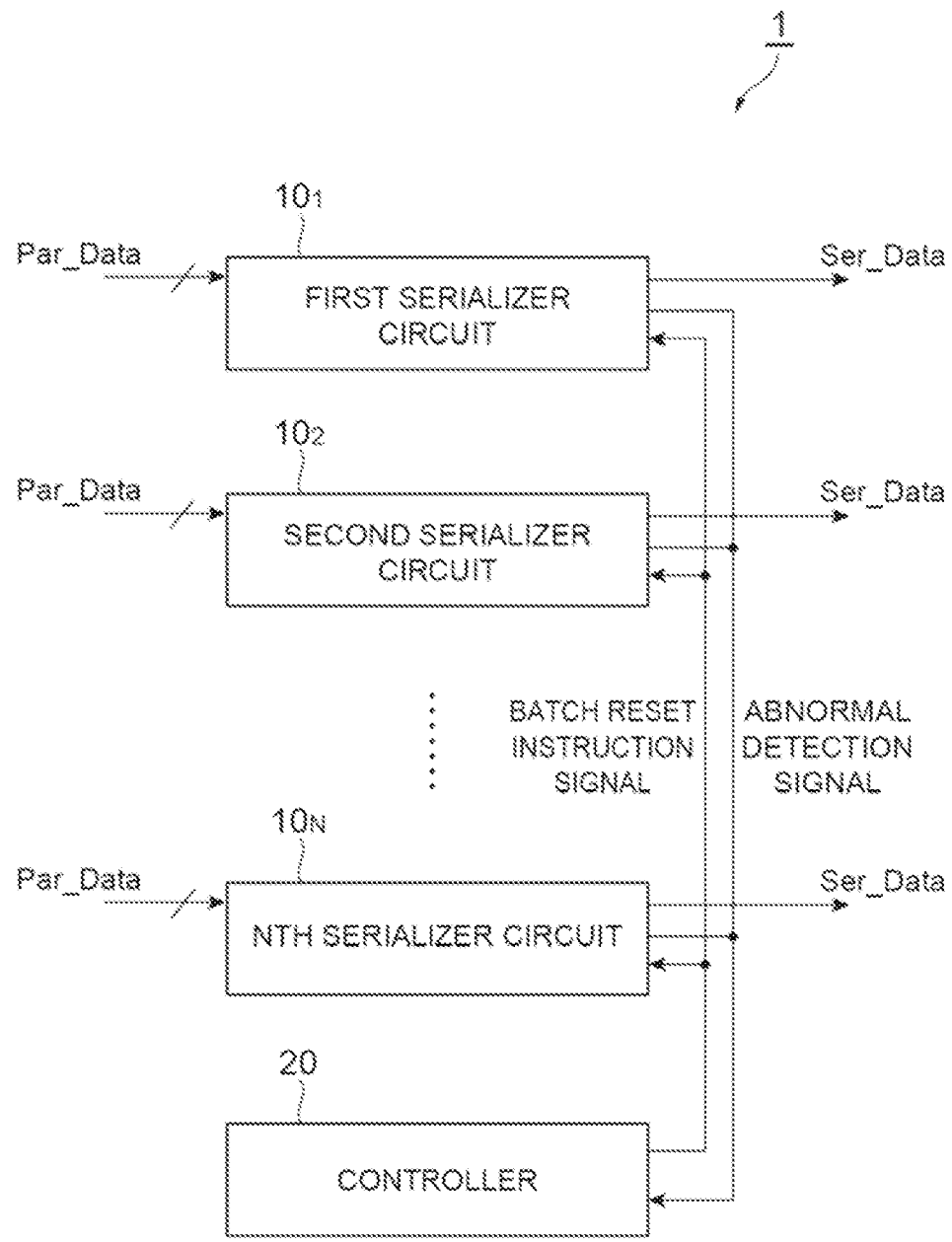
FIG. 1 is a diagram illustrating the configuration of a multi-lane serializer device 1.

Hereinafter, embodiments for carrying out the present invention will be described in detail with reference to the accompanying diagrams. In addition, in the description of the diagrams, the same elements are denoted by the same reference numerals, and the repeated description thereof will be omitted. The present invention is not limited to these examples, but is defined by the claims, and is intended to include all modifications within the meaning and scope equivalent to the claims.

FIG. 1 is a diagram illustrating the configuration of a multi-lane serializer device 1. The multi-lane serializer device 1 includes a plurality of serializer circuits $10_1$ to $10_N$ and a controller 20. Each serializer circuit $10_n$ serializes parallel data Par_Data that is input in synchronization with a first clock CLK1, and outputs serial data Ser_Data in synchronization with a second clock CLK2. N is an integer of 2 or more, and n is an integer of 1 or more and N or less. Each serializer circuit $10_n$ can transmit an abnormal detection signal to the controller 20. When the abnormal detection signal is received from any one of the N serializer circuits $10_1$ to $10_N$, the controller 20 transmits a batch reset instruction signal to each of the N serializer circuits $10_1$ to $10_N$.

FIG. 1 illustrates the first serializer circuit (1st serializer) $10_1$, the second serializer circuit (2nd serializer) $10_2$, the Nth serializer circuit (Nth serializer) $10_N$, and the controller 20. When an abnormal detection signal is output from any of the serializers, the abnormal detection signal is input to the controller 20. When the abnormal detection signal is input, the controller 20 transmits a batch reset instruction signal to each serializer. By receiving the batch reset instruction signal, the serializer circuits $10_1$ to $10_N$ are reset.

Each of the serializer circuits ($10_1$ to $10_N$) includes a plurality of input terminals to which the parallel data Par_Data is input and one output terminal from which the serial data Ser_Data is output. The first serializer circuit $10_1$ converts the parallel data Par_Data into the serial data Ser_Data.

Figure 2:
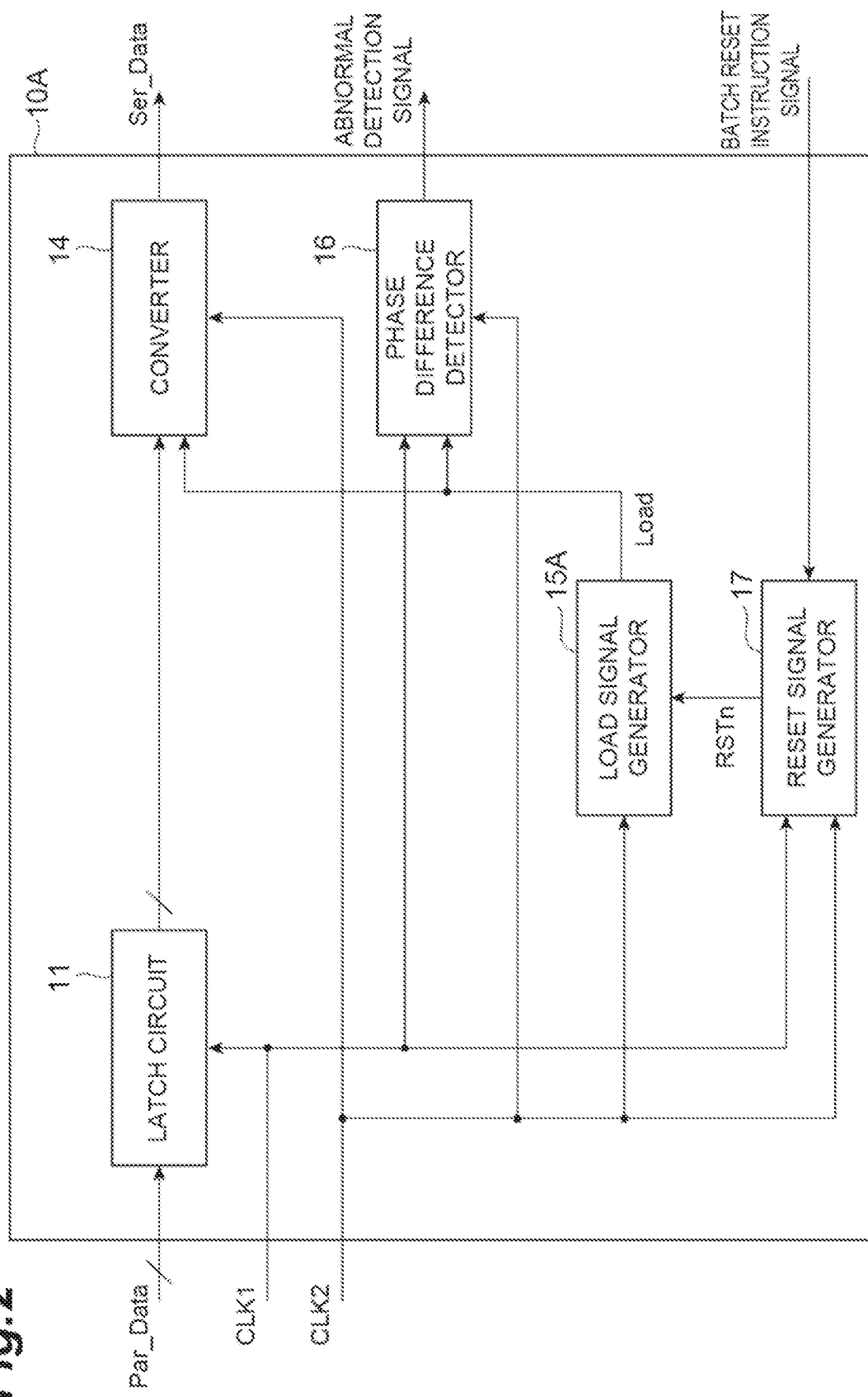
FIG. 2 is a diagram illustrating a configuration example of a serializer circuit.

FIG. 2 is a diagram illustrating a configuration example of a serializer circuit. A serializer circuit 10A illustrated in this diagram is used as each serializer circuit $10_n$ in FIG. 1. The serializer circuit 10A serializes the parallel data Par_Data that is input in synchronization with the first clock CLK1, and outputs the serial data Ser_Data in synchronization with the second clock CLK2. The period of the second clock CLK2 is shorter than the period of the first clock CLK1. The serializer circuit 10A includes a latch circuit 11, a converter 14, a load signal generator 15A, a phase difference detector 16, and a reset signal generator 17.

The latch circuit 11 latches the input parallel data Par_Data at the timing indicated by the first clock CLK1. The latch circuit 11 can have, for example, a configuration in which flip-flops as many as the number of bits of the parallel data Par_Data or more are arranged in parallel. The latch circuit 11 includes a plurality of input terminals to which the parallel data Par_Data is input and a plurality of output terminals from which the values of the held parallel data Par_Data are output.

The converter 14 converts the parallel data into serial data. The converter 14 latches the parallel data latched and output by the latch circuit 11 at the timing indicated by a load signal Load, and outputs the latched data as the serial data Ser_Data in synchronization with the second clock CLK2. The load signal Load has the same period as the first clock CLK1. For example, the converter 14 has a configuration including a shift register in which flip-flops are connected in series, and can latch the parallel data with each flip-flop of the shift register according to the instruction of the load signal Load, shift the shift register according to the instruction of the second clock CLK2, and output the serial data Ser_Data. The converter 14 includes an input terminal to which the parallel data output from the latch circuit 11 is input and an output terminal from which the serial data after serial conversion is output.

The load signal generator 15A generates the load signal Load based on the second clock CLK2. In addition, the load signal generator 15A can reset the operation of a load signal generation according to the instruction of a reset instruction signal RSTn. The load signal generator 15A can be configured to include, for example, a counter and a shift register. The load signal generator 15A can perform a counter operation according to the instruction of the second clock CLK2 to generate a frequency-divided clock, and can reset the counter operation according to the instruction of the reset instruction signal RSTn. In addition, the load signal generator 15A shifts the shift register according to the instruction of the second clock CLK2 (or another clock having a shorter period than the first clock CLK1) using the frequency-divided clock as input data of a flip-flop at the first stage of the shift register, thereby being able to obtain a signal output from a flip-flop at the final stage of the shift register as the load signal Load. The load signal Load output from the load signal generator 15A is given to the converter 14. The load signal generator 15A can be a resettable frequency divider (counter), and includes an input terminal to which the second clock CLK2 is input and an output terminal from which a clock after frequency division is output.

The phase difference detector 16 detects a phase difference between the load signal Load and the first clock CLK1, and outputs an abnormal detection signal to the controller 20 when the detected phase difference is abnormal. The phase difference detector 16 includes a first input terminal to which the first clock CLK1 is input, a second input terminal to which the load signal Load is input, and an output terminal from which an abnormal detection signal according to the phase difference between the two input signals is output. The phase difference detector 16 can be configured by a phase comparator, a phase frequency comparator, or software and a microprocessor, and outputs an abnormal detection signal corresponding to the phase difference between the two input signals.

There are (i) Case where the abnormal detection signal has a voltage value corresponding to the phase difference between two input signals, (ii) Case where the abnormal detection signal is a pulse signal indicating an abnormality when the voltage value is further determined by a threshold value using a comparator and the voltage value exceeds the threshold value, and (iii) Case where the abnormal detection signal is a digital signal obtained by converting the above voltage value or pulse signal into a digital value.

Referring to FIG. 1 again, the controller 20 includes an input terminal to which an abnormal detection signal is input and an output terminal from which a batch reset instruction signal is output. The controller 20 can be configured by a comparator, a logic circuit, or software and a microprocessor. When the abnormal detection signal corresponds to the above (i), the controller 20 can be, for example, a comparator. Therefore, the controller 20 includes a reference input terminal to which a threshold voltage for abnormal determination is input and an input terminal to which the abnormal detection signal is input. When the abnormal detection signal corresponds to the above (ii), the phase difference detector 16 has a function of the comparator. In any configuration, when the level of the voltage value corresponding to the phase difference is higher than the threshold voltage, the controller 20 can output a batch reset instruction signal (pulse signal).

In the case of the above (iii), that is, when the phase difference detector 16 outputs a digital signal or when the controller 20 itself has an input signal digital conversion function, the controller 20 can also be configured by using a logic circuit or software and a microprocessor. When the abnormal detection signal indicating an abnormal state is a digital signal (bit string), the controller 20 determines the meaning of the digital signal and outputs a batch reset instruction signal at the time of a specific bit string. The controller 20 may be a counter that counts the number of abnormal detection signals (pulse signals) indicating an abnormality. In this case, when the count value exceeds a threshold value, determination as an abnormality can be made and a batch reset instruction signal can be output.

When the controller 20 is configured by software and a microprocessor, for example, when an abnormal state is indicated by a 4-bit or 8-bit digital signal, the digital signal can be compared with a state stored in the memory using a look-up table method, and a batch reset instruction signal can be output when the digital signal indicates an "abnormal" state.

When the batch reset instruction signal output from the controller 20 is received, the reset signal generator 17 generates the reset instruction signal RSTn for resetting the operation of a load signal generation in the load signal generator 15A and transmits the generated reset instruction signal RSTn to the load signal generator 15A.

When the load signal generator 15A is a counter, the counter is reset when the counter receives the reset instruction signal RSTn. In addition to the batch reset instruction signal, the first clock CLK1 and the second clock CLK2 are input to the reset signal generator 17.

As an example, the load signal generator 15A is a counter, and generates the load signal Load in synchronization with the second clock CLK2. For example, assuming that the load signal generator 15A is a 3-bit counter, the number of input clock pulses is 5, and 101 is expressed in binary to generate one pulse. Assuming that a logic circuit for logical sum (AND) whose reference bits for comparison are 1, 0, and 1 is connected to each of the output 101 of each bit, the pulse of the load signal Load can be output only when the condition 101 is satisfied. When the count value in the counter is reset to the initial value 0, the timing at which the load signal Load rises is changed.

The second clock CLK2 input to the reset signal generator 17 is a reference clock for generating the reset instruction signal RSTn. That is, the second clock CLK2 is input to both a load signal generator 15B and the reset signal generator 17, and the operation between these generators is synchronized with the second clock CLK2. Therefore, since the reset timing is not asynchronous, an error is unlikely to occur at the time of reset.

The output timing of the reset instruction signal RSTn in the reset signal generator 17 is adjusted by the first clock CLK1. The first clock CLK1 is commonly input to a plurality of serializer circuits 10. Therefore, in order to make the plurality of serializer circuits 10 (a plurality of lanes) operate cooperatively, the common first clock CLK1 is used as the output timing of the reset instruction signal RSTn. Then, each reset signal generator 17 generates the reset instruction signal RSTn with the rising timing (or falling timing) of the common first clock CLK1 as a reference. When the first clock CLK1 is input, the reset instruction signal RSTn is generated in synchronization with the pulse of the second clock CLK2 after the first clock CLK1 in terms of order.

Figure 3:
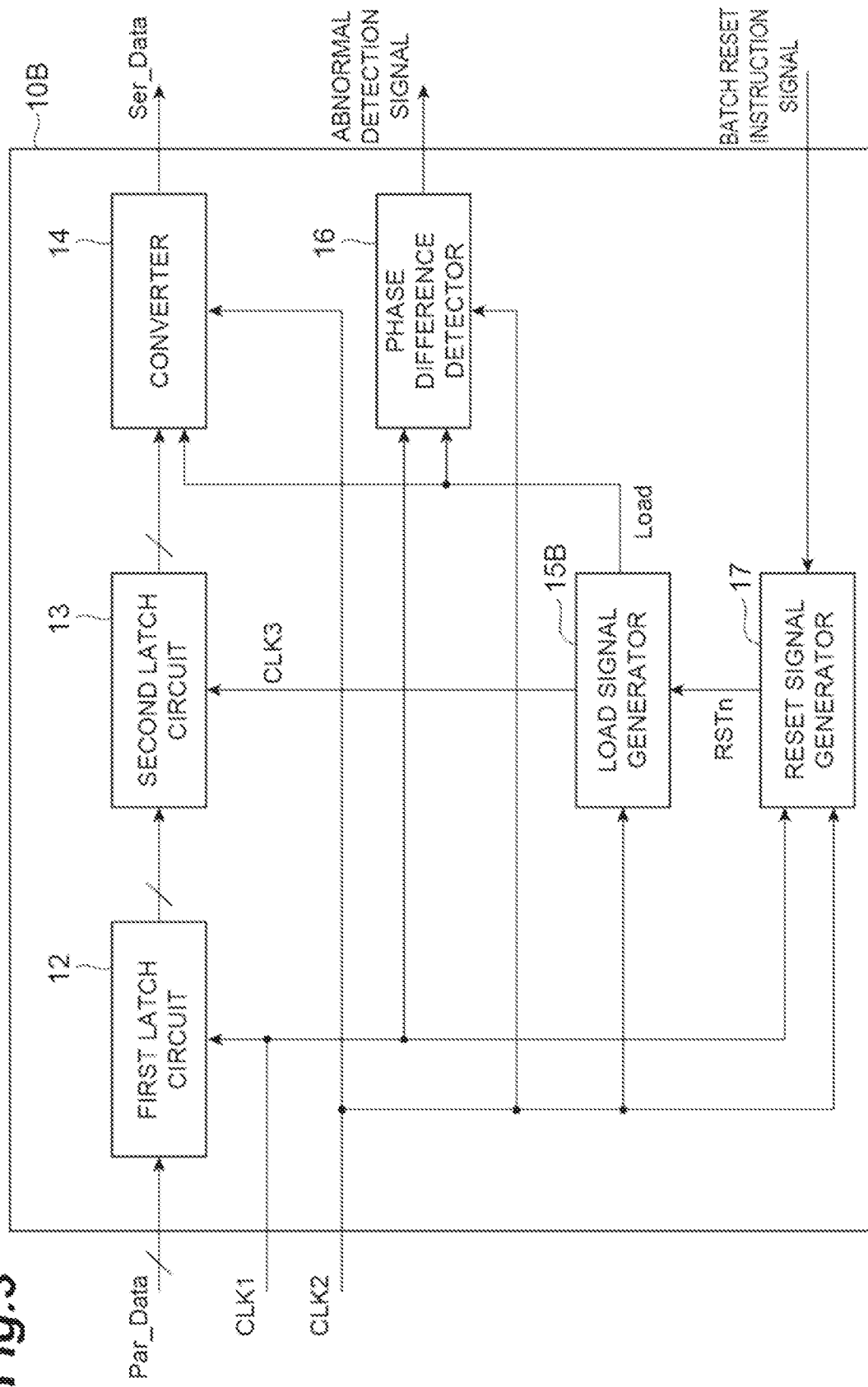
FIG. 3 is a diagram illustrating a configuration example of a serializer circuit.

FIG. 3 is a diagram illustrating a configuration example of a serializer circuit. A serializer circuit 10B illustrated in this diagram is used as each serializer circuit $10_n$ in FIG. 1. The serializer circuit 10B serializes the parallel data Par_Data that is input in synchronization with the first clock CLK1, and outputs the serial data Ser_Data in synchronization with the second clock CLK2. The period of the second clock CLK2 is shorter than the period of the first clock CLK1. The serializer circuit 10B includes a first latch circuit 12, a second latch circuit 13, a converter 14, a load signal generator 15B, a phase difference detector 16, and a reset signal generator 17.

The serializer circuit 10B illustrated in FIG. 3 is different from the configuration of the serializer circuit 10A illustrated in FIG. 2 in that the first latch circuit 12 and the second latch circuit 13 are provided instead of the latch circuit 11 and the load signal generator 15B is provided instead of the load signal generator 15A. The load signal generator 15B is different from the load signal generator 15A in that the second clock CLK2 to a third clock CLK3 are further generated.

The first latch circuit 12 latches and outputs the input parallel data Par_Data at the timing indicated by the first clock CLK1. The second latch circuit 13 latches and outputs the parallel data latched and output by the first latch circuit 12 at the timing indicated by the third clock CLK3. The third clock CLK3 has the same period as the first clock CLK1. Each of the first latch circuit 12 and the second latch circuit 13 can have, for example, a configuration in which flip-flops as many as the number of bits of the parallel data Par_Data or more are arranged in parallel.

The converter 14 latches the parallel data latched and output by the second latch circuit 13 at the timing indicated by the load signal Load, and outputs the latched data as the serial data Ser_Data in synchronization with the second clock CLK2. The load signal Load has the same period as the first clock CLK1. For example, the converter 14 has a configuration including a shift register in which flip-flops are connected in series, and can latch the parallel data with each flip-flop of the shift register according to the instruction of the load signal Load, shift the shift register according to the instruction of the second clock CLK2, and output the serial data Ser_Data.

The load signal generator 15B frequency-divides the second clock CLK2 to generate the third clock CLK3, and generates the load signal Load based on the third clock CLK3. According to the instruction of the reset instruction signal RSTn, the load signal generator 15B can reset the frequency dividing operation, and can reset the operation of a load signal generation. The load signal generator 15B can be configured to include, for example, a counter and a shift register. The load signal generator 15B performs a counter operation according to the instruction of the second clock CLK2 to generate a frequency-divided clock (third clock CLK3). The third clock CLK3 output from the load signal generator 15B is given to the second latch circuit 13. In addition, the load signal generator 15B shifts the shift register according to the instruction of the second clock CLK2 (or another clock having a shorter period than the first clock CLK1) using the third clock CLK3 as input data of a flip-flop at the first stage of the shift register, thereby being able to obtain a signal output from a flip-flop at the final stage of the shift register as the load signal Load. The load signal Load output from the load signal generator 15B is given to the converter 14.

The phase difference detector 16 detects a phase difference between the load signal Load and the first clock CLK1. Alternatively, the phase difference detector 16 may detect a phase difference between the third clock CLK3 and the first clock CLK1. The phase difference detector 16 outputs an abnormal detection signal to the controller 20 when the detected phase difference is abnormal. When the batch reset instruction signal output from the controller 20 is received, the reset signal generator 17 generates the reset instruction signal RSTn for resetting the operation of a load signal generation in the load signal generator 15B and transmits the generated reset instruction signal RSTn to the load signal generator 15B.

A configuration in which the latch circuit 11 is provided before the converter 14 that receives parallel data and outputs serial data (FIG. 2) is preferable, and a configuration in which the latch circuits 12 and 13 of two stages are provided (FIG. 3) is more preferable. This will be described below. Generally, when a transmitter including a serializer circuit is formed on a semiconductor substrate, the layout of the serializer circuit is custom-designed, but the layout of circuits before the latch circuit is automatically arranged and wired by the CAD system. Therefore, since the delay of the parallel data Par_Data input to the latch circuit tends to be large, the setup becomes strict. In addition, a delay variation between bits of the parallel data Par_Data tends to be large. Accordingly, if the setup time varies when the setup is strict, the delay of the output data from the latch circuit also varies greatly. As a result, the timing between the output data of the latch circuit and the load signal Load becomes strict. By providing the second latch circuit after the first latch circuit, the timing restriction of the output data of the first latch circuit is only the rising edge of the third clock CLK3. Therefore, the timing restriction can be reduced.

Figure 4:
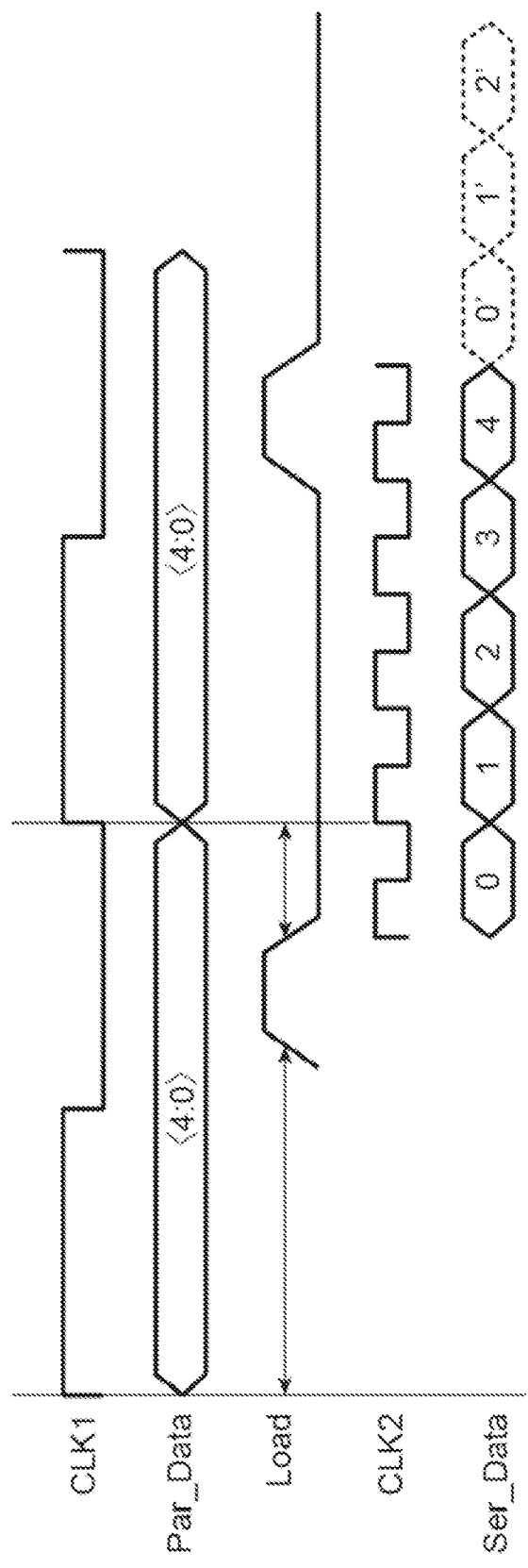
FIG. 4 is a timing chart describing the operation of a serializer circuit.
Figure 5:
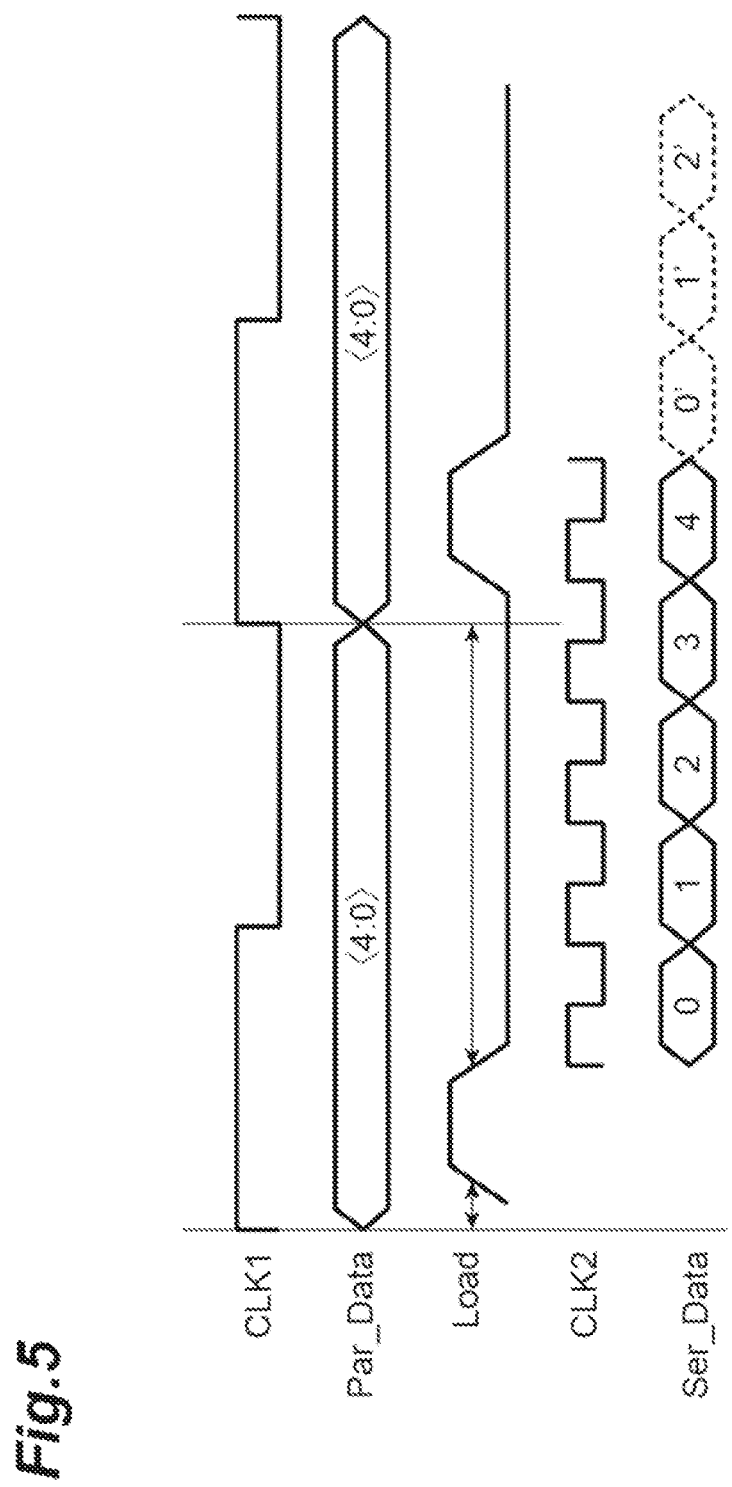
FIG. 5 is a timing chart describing the operation of a serializer circuit.

FIGS. 4 and 5 are timing charts describing the operation of a serializer circuit. In these diagrams, the first clock CLK1, the parallel data Par_Data input to the latch circuit 11 or the first latch circuit 12, the load signal Load, the second clock CLK2, and the serial data Ser_Data are shown in this order from the top. In these diagrams, the parallel data Par_Data is 5-bit data.

The parallel data Par_Data, the first clock CLK1, and the second clock CLK2 are input to the serializer circuit. As shown in these diagrams, the first clock CLK1 is synchronized with the parallel data Par_Data. The second clock CLK2 is synchronized with the serial data Ser_Data. The period of the second clock CLK2 is shorter than the period of the first clock CLK1. The load signal Load has the same period as the first clock CLK1.

As shown in FIG. 4, it is important that the phase difference between the first clock and the load signal is set within an appropriate range according to the margins of the setup time and the hold time during the latch operation by the converter 14.

On the other hand, as shown in FIG. 5, the phase difference between the first clock CLK1 and the load signal Load may deviate from the appropriate range according to the margins of the setup time and the hold time during the latch operation by the converter 14. Factors that cause such a situation include a malfunction of the load signal generator due to noise and a phase shift of the first clock due to a temperature change.

The inventions disclosed in Patent Literatures 2 and 3 detect a phase difference between the first clock CLK1 and the load signal Load, and reset or temporarily stop the operation of a load signal generator that generates a load signal when the detected phase difference is out of an appropriate range. In this manner, the serializer circuit can recover the phase difference between the first clock CLK1 and the load signal Load within the appropriate range, so that the bit error rate can be reduced at an early stage with a simple configuration.

Figure 6:
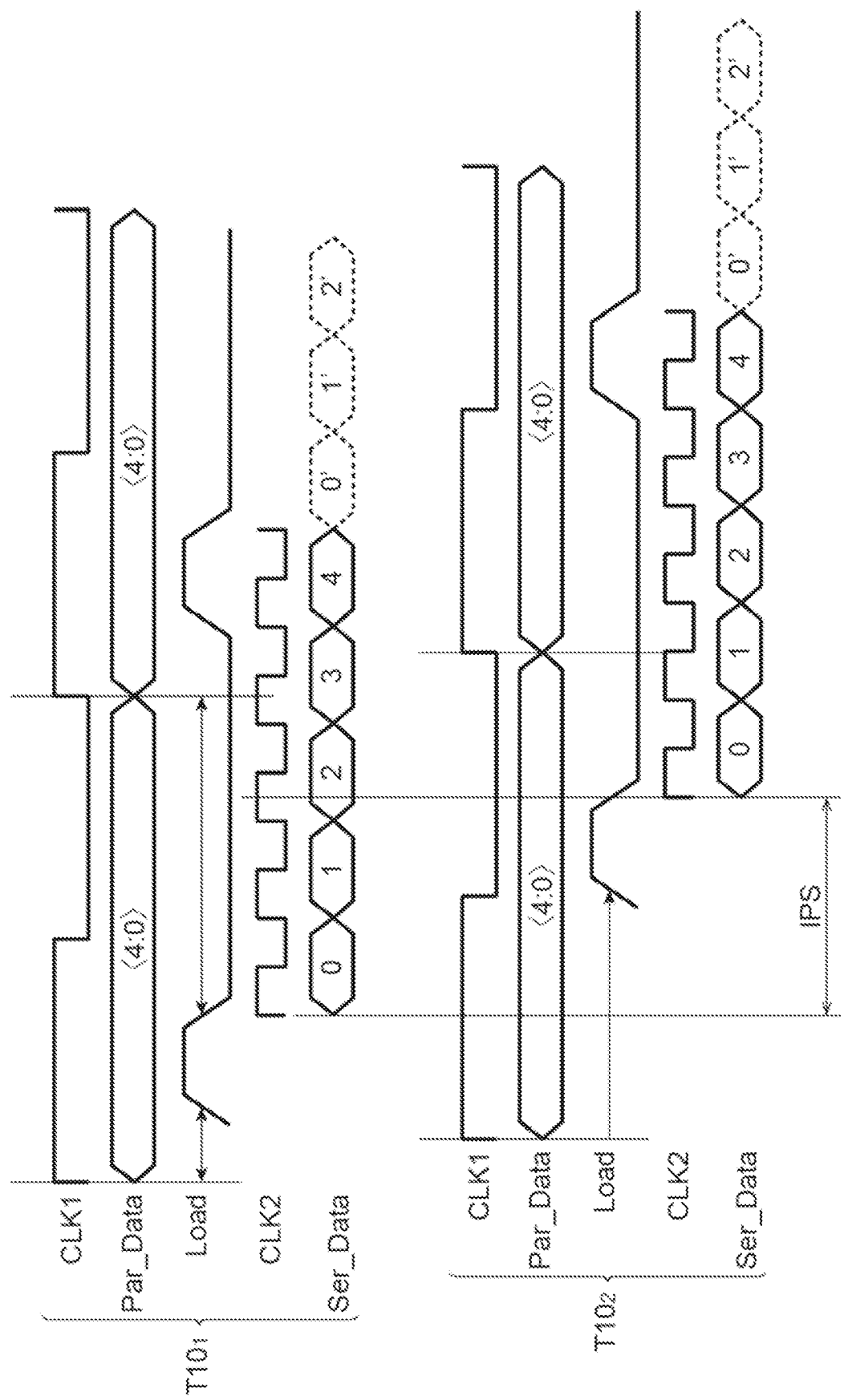
FIG. 6 is a timing chart describing a problem in the operation of a multi-lane serializer device including serializer circuits of a plurality of lanes.

However, in a multi-lane serializer device including serializer circuits of a plurality of lanes, assuming that each serializer circuit is configured as in the inventions disclosed in Patent Literatures 2 and 3, the following problem may occur. FIG. 6 is a timing chart describing a problem in the operation of a multi-lane serializer device including serializer circuits of a plurality of lanes. In these diagrams, in the timing chart $T10_1$ of the first serializer circuit $10_1$, the first clock CLK1, the parallel data Par_Data, the load signal Load, the second clock CLK2, and the serial data Ser_Data are shown in this order from the top. In the timing chart $T10_2$ of the second serializer circuit $10_2$, the first clock CLK1, the parallel data Par_Data, the load signal Load, the second clock CLK2, and the serial data Ser_Data are shown.

As shown in FIG. 6, the input timings of the first clock CLK1 to the respective serializer circuits are slightly different due to the skew between lanes. Therefore, when the operation of a load signal generation is reset or temporarily stopped individually in each serializer circuit when necessary, the output timing of serial data may be significantly different between the serializer circuits of a plurality of lanes.

In the example shown in FIG. 6, the input timing of the first clock CLK1 to the second serializer circuit is later than the input timing of the first clock CLK1 to the first serializer circuit. In the first serializer circuit, although the phase of the load signal Load is slightly advanced, the phase difference between the first clock CLK1 and the load signal Load is within the appropriate range. On the other hand, in the second serializer circuit, the phase of the load signal Load is greatly advanced, and the phase difference between the first clock CLK1 and the load signal Load is out of the appropriate range. Therefore, the operation of a load signal generation in the load signal generator is reset. As a result, the required specifications for the IPS may not be satisfied between the pieces of serial data output from the first serializer circuit and the second serializer circuit.

The multi-lane serializer device 1 of the present embodiment has been made to solve such a problem, and it is possible to reduce the bit error rate at an early stage with a simple configuration in each serializer circuit and reduce the IPS between the serializer circuits of a plurality of lanes.

That is, in the present embodiment, the phase difference detector 16 of each of the N serializer circuits $10_1$ to $10_N$ detects the phase difference between the load signal Load and the first clock CLK1, and outputs an abnormal detection signal to the controller 20 when the detected phase difference is abnormal (when the phase difference is not within the appropriate range). When the abnormal detection signal is received from any one of the N serializer circuits $10_1$ to $10_N$, the controller 20 transmits a batch reset instruction signal to each of the N serializer circuits $10_1$ to $10_N$. Then, in each of the N serializer circuits $10_1$ to $10_N$, when the batch reset instruction signal output from the controller 20 is received, the reset signal generator 17 transmits the reset instruction signal RSTn to the load signal generators 15A and 15B to reset the operation of a load signal generation in the load signal generators 15A and 15B.

Thus, when the phase difference between the load signal Load and the first clock CLK1 is abnormal in any one of the N serializer circuits $10_1$ to $10_N$, the operation of a load signal generation in the load signal generators 15A and 15B in all of the N serializer circuits $10_1$ to $10_N$ is reset. In this manner, the IPS between the serializer circuits of a plurality of lanes can be reduced.

As described above, the above-described multi-lane serializer device includes a plurality of serializer circuits 10n (10A, 10B) and the controller 20 including an output terminal for a batch reset instruction signal. Each serializer circuit 10$_n$ (10A, 10B) includes a parallel-serial converter (converter 14), a load signal generator (15A, 15B), the reset signal generator 17, and the phase difference detector 16.

The parallel-serial converter (converter 14) includes a parallel data input terminal, an input terminal for the load signal Load for timing to hold the parallel data, an input terminal for a clock (second clock CLK2) for timing to serially convert the held parallel data, and a serial data output terminal.

The load signal generator (15A, 15B) includes an input terminal for the clock (second clock CLK2), an output terminal for the load signal Load generated by frequency-dividing the clock, and an input terminal for receiving the reset instruction signal RSTn.

The reset signal generator 17 includes an input terminal for the batch reset instruction signal and an output terminal for the reset instruction signal RSTn.

The phase difference detector 16 includes an input terminal for a reference clock (first clock CLK1), an input terminal for the load signal Load, and an output terminal, and the controller 20 generates the batch reset instruction signal based on the abnormal detection signal from the output terminal (for example, regarded as abnormal when the phase difference between the load signal Load and the first clock CLK1 exceeds the reference value). In addition, the above-described clock is also referred to as a clock signal.

In addition, in FIG. 2 (or FIG. 3), when the reset signal generator 17 receives the batch reset instruction signal, the reset signal generator 17 outputs the reset instruction signal RSTn to the load signal generator 15A (or 15B), so that the load signal generator 15A (or 15B) is reset. The load signal generator 15A (or 15B) is a counter that counts the number of pulses of the second clock CLK2 and outputs the load signal Load when the count value reaches a predetermined number. When the counter is reset, the rising timing of the load signal Load is changed. Here, in addition to the batch reset instruction signal, the first clock CLK1 and the second clock CLK2 are also input to the reset signal generator 17. Even if the first clock CLK1 and the second clock CLK2 are not input to the reset signal generator 17, the load signal generator as a counter can be reset. In addition, as described above, the output timing of the reset instruction signal RSTn can be adjusted based on the first clock CLK1 and the second clock CLK2.

In addition, as illustrated in FIG. 2, each serializer circuit further includes the latch circuit 11 including a parallel data input terminal and a parallel data output terminal, and the output terminal of the latch circuit 11 is connected to the input terminal of the parallel-serial converter (converter 14).

In addition, as illustrated in FIG. 3, each serializer circuit further includes the first latch circuit 12, which includes a parallel data input terminal and a parallel data output terminal, and the second latch circuit 13, which includes a parallel data input terminal and a parallel data output terminal, and the output terminal of the first latch circuit 12 is connected to the input terminal of the second latch circuit 13 and the output terminal of the second latch circuit 13 is connected to the input terminal of the parallel-serial converter (converter 14).

In addition, the configuration of the present embodiment may be applied to a video transmission interface such as a display interface used for a display device, such as a television and a monitor, and a camera interface used for an imaging apparatus, such as a camera and a video.

In general, in the video transmission interface described above, both or either of the real-time property and the smoothness of video transmission is emphasized. For this reason, compared with other data communication methods, there is a high request to solve the delay and the IPS, and it is often difficult or impossible to perform retransmission when communication fails. In addition, in recent years, a high-speed video transmission interface is required as the definition of video increases. In the case of trying to realize this with a configuration using a FIFO or the like as in other data communication methods, not only is it difficult to meet the requirements for ensuring both or either of the real-time property and the smoothness of high-speed video transmission, but also the power and the area increase when an integrated circuit is used. Since the configuration of the present embodiment can reduce the IPS between the serializer circuits of a plurality of lanes, even if the configuration of the present embodiment is applied to the video transmission interface described above, it is possible to ensure both or either of the real-time performance and the smoothness of high-speed video transmission and to suppress an increase in power and area when an integrated circuit is used.

REFERENCE SIGNS LIST

1: multi-lane serializer device, $10_1$ to $10_N$, 10A, 10B: serializer circuit, 11: latch circuit, 12: first latch circuit, 13: second latch circuit, 14: converter, 15A, 15B: load signal generator, 16: phase difference detector, 17: reset signal generator, 20: controller.

The invention claimed is:
1. A multi-lane serializer device, comprising:
serializer circuits each serializing parallel data input in synchronization with a first clock and outputting serial data in synchronization with a second clock; and
a controller that controls operations of the serializer circuits,
wherein each of the serializer circuits includes:
a converter that latches the parallel data at a timing indicated by a load signal having the same period as the first clock and outputs the latched data as serial data in synchronization with the second clock;
a load signal generator that generates the load signal based on the second clock, wherein the load signal generator resets an operation of a load signal generation when the load signal generator receives a reset instruction signal;
a phase difference detector that detects a phase difference between the load signal and the first clock and outputs an abnormal detection signal to the controller when the detected phase difference is abnormal; and
a reset signal generator that generates the reset instruction signal and provides the generated reset instruction signal to the load signal generator when the reset signal generator receives a batch reset instruction signal output from the controller,
wherein the controller provides the batch reset instruction signal to the reset signal generator of each of the serializer circuits when the controller receives the abnormal detection signal from the phase difference detector of any one of the serializer circuits.

2. The multi-lane serializer device according to claim 1, wherein each of the serializer circuits further includes a latch circuit that latches the input parallel data at a timing indicated by the first clock, and
wherein in each of the serializer circuits, the converter latches the parallel data latched and output by the latch circuit at a timing indicated by the load signal.
3. The multi-lane serializer device according to claim 1, wherein each of the serializer circuits further includes:
a first latch circuit that latches the input parallel data at a timing indicated by the first clock; and
a second latch circuit that latches the parallel data latched and output by the first latch circuit at a timing indicated by a third clock having the same period as the first clock, and
wherein in each of the serializer circuits, the converter latches the parallel data latched and output by the second latch circuit at a timing indicated by the load signal.
4. A multi-lane serializer device, comprising:
serializer circuits; and
a controller including an output terminal for a batch reset instruction signal,
wherein each of the serializer circuits includes:
a parallel-serial converter including: a parallel data input terminal, an input terminal for a load signal for timing to hold parallel data, an input terminal for a clock for timing to serially convert the held parallel data, and a serial data output terminal;
a load signal generator including: an input terminal for the clock, an output terminal for the load signal generated by frequency-dividing the clock, and an input terminal for receiving a reset instruction signal;
a reset signal generator including: an input terminal for the batch reset instruction signal, and an output terminal for the reset instruction signal; and
a phase difference detector including: a reference clock input terminal, an input terminal for the load signal, and an output terminal, wherein the controller generates the batch reset instruction signal based on an abnormal detection signal from the output terminal.
5. The multi-lane serializer device according to claim 4, wherein each of the serializer circuits further comprises a latch circuit including a parallel data input terminal and a parallel data output terminal, and the output terminal of the latch circuit is connected to the input terminal of the parallel-serial converter.
6. The multi-lane serializer device according to claim 4, wherein each of the serializer circuits further comprises:
a first latch circuit including a parallel data input terminal and a parallel data output terminal; and
a second latch circuit including a parallel data input terminal and a parallel data output terminal,
wherein the output terminal of the first latch circuit is connected to the input terminal of the second latch circuit, and
wherein the output terminal of the second latch circuit is connected to the input terminal of the parallel-serial converter.

* * * * *